(12) United States Patent
Guo

(10) Patent No.: US 11,508,731 B1
(45) Date of Patent: Nov. 22, 2022

(54) SEMICONDUCTOR STRUCTURE AND MANUFACTURING METHOD THEREOF

(71) Applicant: CHANGXIN MEMORY TECHNOLOGIES, INC., Hefei (CN)

(72) Inventor: Shuai Guo, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/807,747

(22) Filed: Jun. 20, 2022

Related U.S. Application Data

(63) Continuation of application No. PCT/CN2022/070590, filed on Jan. 6, 2022.

(30) Foreign Application Priority Data

Oct. 22, 2021 (CN) .......................... 202111231509.3

(51) Int. Cl.
*H01L 27/108* (2006.01)
*H01L 29/78* (2006.01)

(52) U.S. Cl.
CPC .. *H01L 27/10805* (2013.01); *H01L 27/10873* (2013.01); *H01L 27/10885* (2013.01); *H01L 27/10891* (2013.01); *H01L 29/7827* (2013.01)

(58) Field of Classification Search
None
See application file for complete search history.

(56) References Cited

U.S. PATENT DOCUMENTS

| 9,698,261 B2 | 7/2017 | Wang et al. |
| 2004/0157353 A1* | 8/2004 | Ouyang .............. H01L 29/7781 438/38 |
| 2006/0040440 A1 | 2/2006 | Chen et al. |

FOREIGN PATENT DOCUMENTS

| CN | 105280698 A | 1/2016 |
| CN | 106328654 A | 1/2017 |
| CN | 111969058 A | 11/2020 |
| CN | 113380898 A | 9/2021 |

OTHER PUBLICATIONS

International Search Report cited in PCT/CN2022/070590 dated Apr. 25, 2022, 11 pages.
Written Opinion cited in PCT/CN2022/070590 dated Apr. 25, 2022, 7 pages.

* cited by examiner

*Primary Examiner* — Anthony Ho
*Assistant Examiner* — Kevin Quinto
(74) *Attorney, Agent, or Firm* — Cooper Legal Group, LLC

(57) ABSTRACT

The present application provides a semiconductor structure and a manufacturing method thereof, relates to the technical field of semiconductors. The manufacturing method of a semiconductor structure includes: providing a substrate; forming a plurality of laminated structures arranged at intervals on the substrate, the laminated structure includes a first conductive layer, an insulating layer, and a second conductive layer, and at least one of the first conductive layer and the second conductive layer is a semi-metal layer; forming a channel layer covering the laminated structures, and a dielectric layer covering the channel layer; and forming word lines (WLs) extending along a first direction, the WL includes a plurality of contact parts and a connecting part connecting adjacent contact parts, the contact part surrounds and is in contact with a side surface of the dielectric layer, and the contact part is opposite to at least a part of the insulating layer.

15 Claims, 16 Drawing Sheets

SEMICONDUCTOR STRUCTURE AND MANUFACTURING METHOD THEREOF

CROSS-REFERENCE TO RELATED APPLICATIONS

The present disclosure is a continuation application of International Patent Application No. PCT/CN2022/070590, filed on Jan. 6, 2022, which claims the priority to Chinese Patent Application 202111231509.3, titled "SEMICONDUCTOR STRUCTURE AND MANUFACTURING METHOD THEREOF" and filed with the China National Intellectual Property Administration (CNIPA) on Oct. 22, 2021. The entire contents of International Patent Application No. PCT/CN2022/070590 and Chinese Patent Application 202111231509.3 are incorporated herein by reference.

TECHNICAL FIELD

The present application relates to the technical field of semiconductors, and in particular to a semiconductor structure and a manufacturing method thereof.

BACKGROUND

The semiconductor structure may include memory cells. The memory cell usually includes a transistor and a capacitor electrically connected to the transistor. The capacitor stores data information, and the transistor controls the reading and writing of data information in the capacitor. The gate of the transistor is electrically connected to a word line (WL), and the on and off of the transistor is controlled by the voltage on the WL. One of a source and a drain of the transistor is electrically connected to a bit line (BL), and the other of the source and the drain is electrically connected to the capacitor. Data information is stored or outputted by using the BL.

As a size of the semiconductor structure becomes more miniaturized, gate-all-around (GAA) transistors are usually used. In the related art, the GAA transistor includes a first conductive layer, a channel region, and a second conductive layer that are stacked sequentially. One of the first conductive layer and the second conductive layer is a source, and the other is a drain. A dielectric layer surrounds the side surface of the channel region, and a gate is disposed on the dielectric layer. However, the foregoing transistor has a relatively large contact resistance with another structure (for example, a BL or a capacitor), the transistor requires a relatively large current, and the semiconductor structure has poor performance.

SUMMARY

A first aspect of the embodiments of the present application provides a manufacturing method of a semiconductor structure, including: providing a substrate; forming a plurality of laminated structures arranged at intervals on the substrate, where each of the laminated structures includes a first conductive layer, an insulating layer, and a second conductive layer that are stacked sequentially, and at least one of the first conductive layer and the second conductive layer is a semi-metal layer; forming a channel layer covering the laminated structures, and a dielectric layer covering the channel layer; and forming WLs extending along a first direction, where the WL includes a plurality of contact parts and a connecting part connecting adjacent contact parts, the contact part surrounds and is in contact with a side surface of the dielectric layer, and the contact part is opposite to at least a part of the insulating layer.

A second aspect of the embodiments of the present application provides a semiconductor structure, including: laminated structures, a channel layer covering side surfaces of the laminated structures, and a dielectric layer covering a side surface of the channel layer, and a gate annularly provided on the dielectric layer, where each of the laminated structures includes a first conductive layer, an insulating layer, and a second conductive layer that are stacked sequentially, one of the first conductive layer and the second conductive layer is a source, the other of the first conductive layer and the second conductive layer is a drain, and at least one of the source and the drain is a semi-metal layer.

DETAILED DESCRIPTION

In the manufacturing method of the semiconductor structure provided in embodiments of the present application, vertical transistors are formed, and at least one of a source and a drain in the vertical transistor is a semi-metal layer, to reduce a contact resistance between the vertical transistor and another structure, and a contact resistance inside the vertical transistor, thereby improving the performance of the semiconductor structure.

In order to make the objectives, features and advantages of the embodiments of the present application clearer, the technical solutions in the embodiments of the present application are described clearly and completely below with reference to the accompanying drawings in the embodiments of the present application. Apparently, the described embodiments are some rather than all of the embodiments of the present application. All other embodiments obtained by those of ordinary skill in the art based on the embodiments of present application without creative efforts should fall within the protection scope of the present application.

Figure 1:
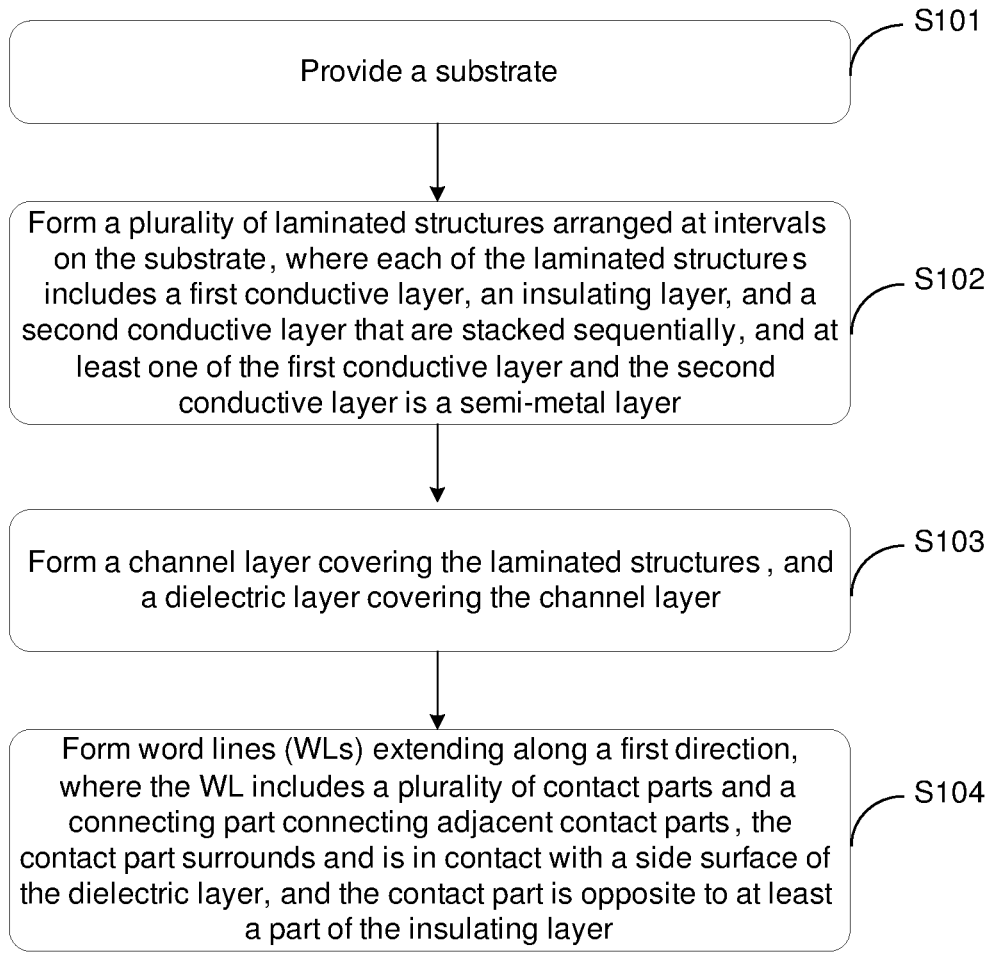
FIG. 1 is a flowchart of a manufacturing method of a semiconductor structure according to an embodiment of the present application.

With reference to FIG. 1, an embodiment of the present application provides a manufacturing method of a semiconductor structure, including the following steps:

step S101: Provide a substrate.

A substrate 10 may be a semiconductor substrate. For example, the substrate 10 may be a silicon substrate, a germanium substrate, a silicon germanium substrate, a gallium nitride substrate, a gallium arsenide substrate, a silicon-on-insulator (SOI) substrate, a germanium-on-insulator (GOI) substrate, or the like. The substrate 10 may be doped or not. For example, the substrate 10 may be a N-type substrate or a P-type substrate.

Figure 2:
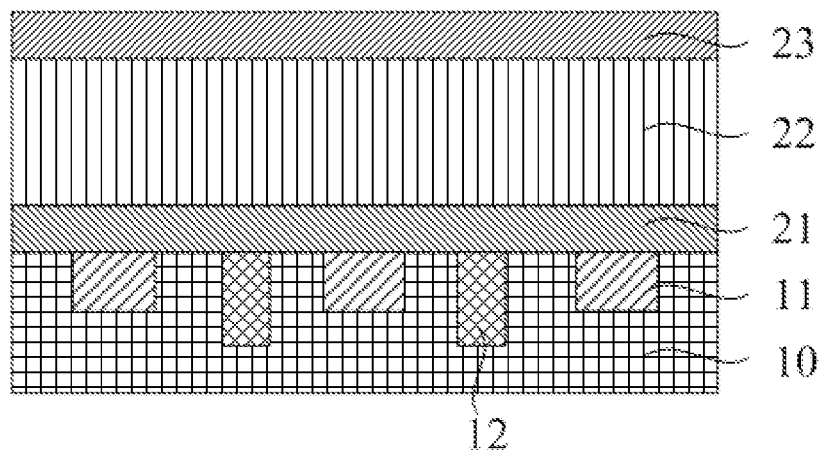
FIG. 2 is a schematic diagram of a first cross section after a second conductive layer is formed according to an embodiment of the present application.
Figure 3:
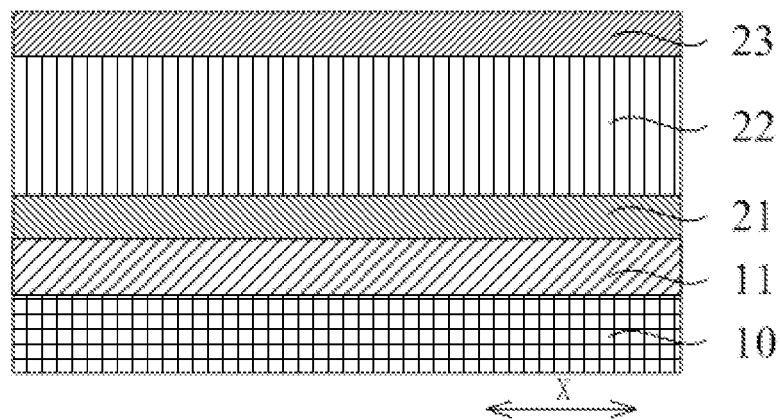
FIG. 3 is a schematic diagram of a second cross section after the second conductive layer is formed according to an embodiment of the present application.

In some possible examples, with reference to FIG. 2 and FIG. 3, a first cross section shown in FIG. 2 is a plane perpendicular to a second direction. A second cross section shown in FIG. 3 is a plane perpendicular to the second direction. A plurality of BLs 11 may be also disposed in the substrate 10, are spaced apart from each other, and extend along the second direction. As shown in FIG. 3, the plurality of BLs 11 extend along a horizontal direction (a direction X shown in FIG. 3). As shown in FIG. 2 and FIG. 3, the BLs 11 may be exposed on the surface of the substrate 10. The BLs 11 are exposed on the upper surface of the substrate 10, to be electrically connected to another structure on the substrate 10.

With reference to FIG. 2 and FIG. 3, a shallow trench isolation (STI) structure 12 is also disposed in the substrate 10. The STI structure 12 is disposed between adjacent BLs 11, to isolate them. The STI structure 12 may be filled with an insulating material such as silicon nitride or silicon oxide.

Figure 4:
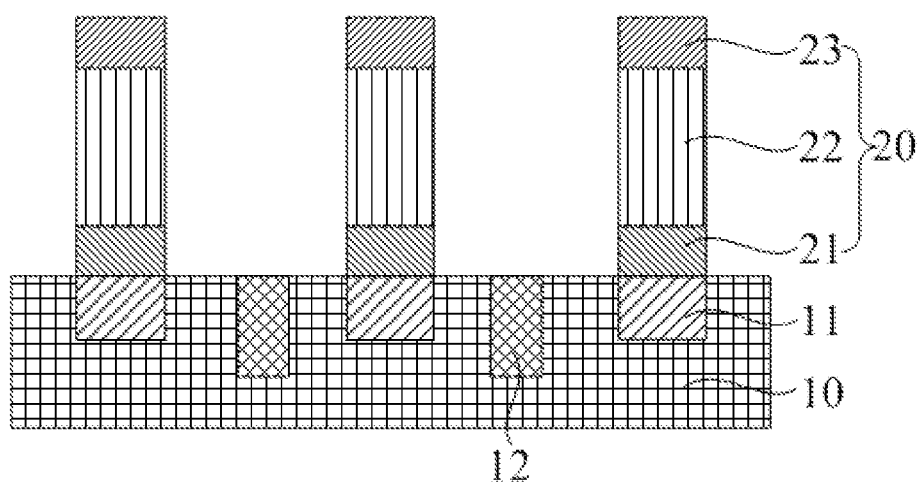
FIG. 4 is a schematic diagram of a first cross section after laminated structures are formed according to an embodiment of the present application.
Figure 5:
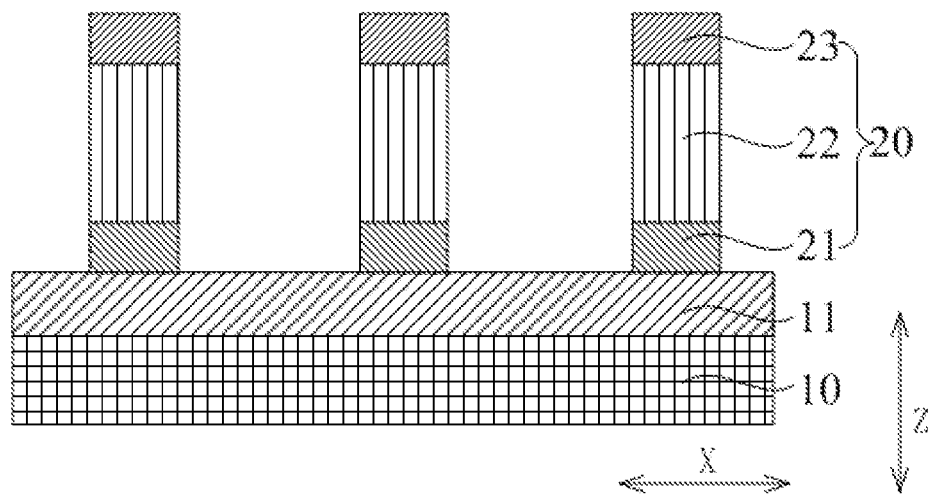
FIG. 5 is a schematic diagram of a second cross section after the laminated structures are formed according to an embodiment of the present application.

Step S102: Form a plurality of laminated structures arranged at intervals on the substrate, where each of the laminated structures includes a first conductive layer, an insulating layer, and a second conductive layer that are stacked sequentially, and at least one of the first conductive layer and the second conductive layer is a semi-metal layer. With reference to FIG. 4 and FIG. 5, a plurality of laminated structures 20 are formed on the substrate 10, and are disposed at intervals. The laminated structure 20 includes a first conductive layer 21, an insulating layer 22, and a second conductive layer 23. One of the first conductive layer 21 and the second conductive layer 23 is electrically connected to a capacitor, and the other of the first conductive layer 21 and the second conductive layer 23 is electrically connected to the BLs 11. For example, the first conductive layer 21, the insulating layer 22, and the second conductive layer 23 are stacked sequentially in a vertical direction (a direction Z shown in FIG. 5). The first conductive layer 21 is electrically connected to BL 11, and the second conductive layer 23 is electrically connected to the capacitor.

The insulating layer 22 may be an oxide layer. For example, a material of the insulating layer 22 may be silicon oxide. At least one of the first conductive layer 21 and the second conductive layer 23 is a semi-metal layer. For example, the first conductive layer 21 is a semi-metal layer, and the second conductive layer 23 is also a semi-metal layer. A material of the semi-metal layer may be bismuth. The first conductive layer 21 and/or the second conductive layer 23 are/is disposed as a semi-metal layer, which can reduce a contact resistance between the laminated structure 20 and the BL 11 and/or a capacitor, thereby improving the performance of the semiconductor structure.

With reference to FIG. 4 and FIG. 5, at least one of laminated structures 20 is disposed on each of the BLs 11 along a second direction (a direction X shown in FIG. 5). The first conductive layer 21 is in contact with the BL 11, such that the first conductive layer 21 is electrically connected to the BL 11. The laminated structure 20 may be in a shape of a column, such as a cylinder, an elliptical column, a square column, or a rectangular column. The laminated structures 20 may be arranged in an array.

With reference to FIG. 2 to FIG. 5, in some possible examples, a plurality of laminated structures 20 are arranged at intervals on the substrate 10, where the laminated structure 20 includes the first conductive layer 21, the insulating layer 22, and the second conductive layer 23 that are stacked sequentially, and at least one of the first conductive layer 21 and the second conductive layer 23 is a semi-metal layer, which includes following steps.

The first conductive layer 21, the insulating layer 22, and the second conductive layer 23 that are stacked are formed through deposition on the substrate 10. As shown in FIG. 2 and FIG. 3, the first conductive layer 21 is deposited on the substrate 10, the insulating layer 22 is deposited on the first conductive layer 21, and the second conductive layer 23 is deposited on the insulating layer 22. The deposition may be a chemical vapor deposition (CVD), a physical vapor deposition (PVD), or an atomic layer deposition (ALD).

Then, the first conductive layer 21, the insulating layer 22, and the second conductive layer 23 are etched, to form the plurality of laminated structures 20 arranged at intervals. As shown in FIG. 4 and FIG. 5, a part of the first conductive layer 21, a part of the insulating layer 22, and a part of the second conductive layer 23 are removed through dry etching or wet etching, such that the retained first conductive layer 21, the retained insulating layer 22, the retained second conductive layer 23 are separated to form the plurality of laminated structures 20 that are spaced apart from each other.

Step S103: Form a channel layer covering the laminated structures, and a dielectric layer covering the channel layer.

Figure 6:
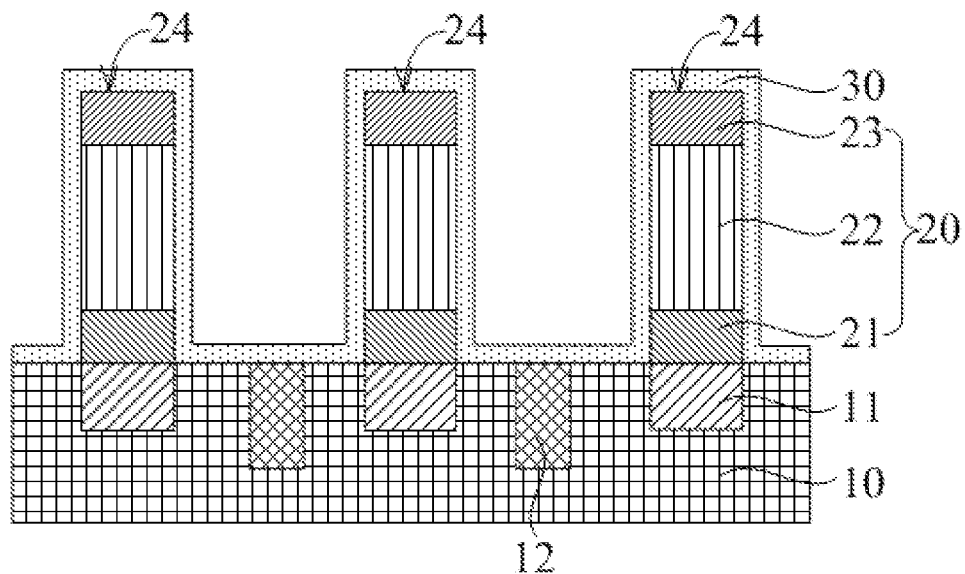
FIG. 6 is a schematic diagram of a first cross section after a channel layer is formed according to an embodiment of the present application.
Figure 7:
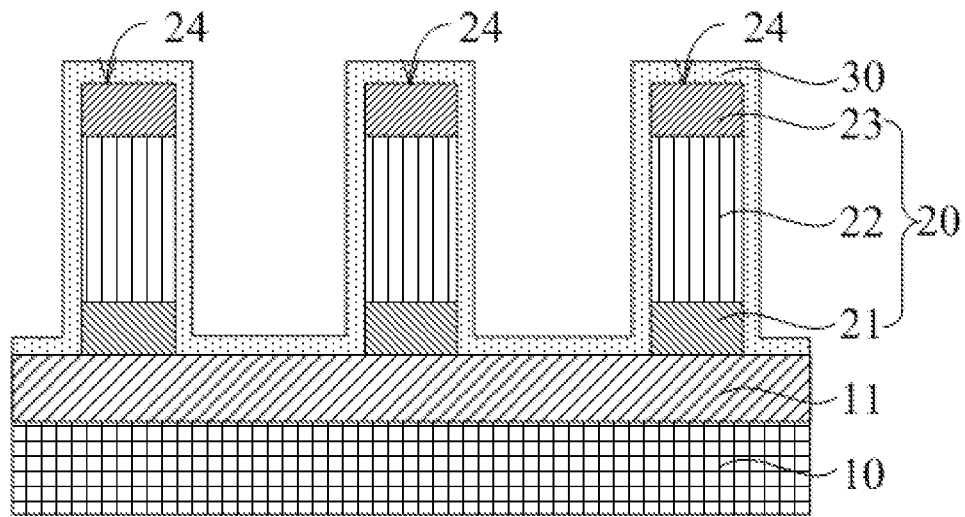
FIG. 7 is a schematic diagram of a second cross section after the channel layer is formed according to an embodiment of the present application.

With reference to FIG. 6 to FIG. 9, the channel layer 30 covers the laminated structures 20. The dielectric layer 40 covers the channel layer 30. Specifically, the channel layer 30 covers the side surfaces and the top surfaces of the laminated structures 20. The dielectric layer 40 covers the side surface and the top surface of the channel layer 30, where the top surface is away from the substrate 10. As shown in FIG. 6 and FIG. 7, the channel layer 30 covers an outer peripheral surface of the first conductive layer 21, an outer peripheral surface of the insulating layer 22, and an outer peripheral surface of the second conductive layer 23. The channel layer 30 further covers the top surface 24 of the second conductive layer.

One of the first conductive layer 21 and the second conductive layer 23 forms a source, and the other forms a drain. The channel layer 30 surrounding the side surface of the laminated structure 20 forms a channel region, to provide a conductive channel between the source and the drain, such that carriers can move from the source to the drain or vice versa. The dielectric layer 40 may be an oxide layer, and the dielectric layer 40 on the side surface of the channel layer 30 forms a gate oxide layer.

As shown in FIG. 6 and FIG. 7, the channel region is layered. A material of the channel layer 30 may include molybdenum sulfide, such as molybdenum disulfide, transition metal sulfur compounds (TMDs), or the like. There is a band gap in the layered molybdenum sulfide, which forms a field effect transistor with a high on-off ratio. In addition, the layered molybdenum sulfide has a high specific surface area, which is beneficial to overcome the short channel effect. The on-off ratio refers to the ratio of the on-state current to the off-state current of a device. Specifically, in a transistor, when the source-drain voltage remains unchanged, the ratio of the source-drain current measured when the gate voltage is applied to that when the gate voltage is not applied is the on-off ratio.

In some possible embodiments, the material of the channel layer 30 is molybdenum sulfide, and the material of the semi-metal layer is bismuth. Preferably, the channel layer 30 is made of molybdenum sulfide, and the first conductive layer 21 and the second conductive layer 23 are both made of bismuth. Through such a disposal, the energy barriers at the interfaces of molybdenum sulfide and bismuth are reduced, which can reduce the metal-induced gap states (MIGSs) between the channel layer 30 and the first conductive layer 21, and between the channel layer 30 and the second conductive layer 23, thereby reducing the contact resistances between the channel layer 30 and the first conductive layer 21 and between the channel layer 30 and the second conductive layer 23.

Figure 8:
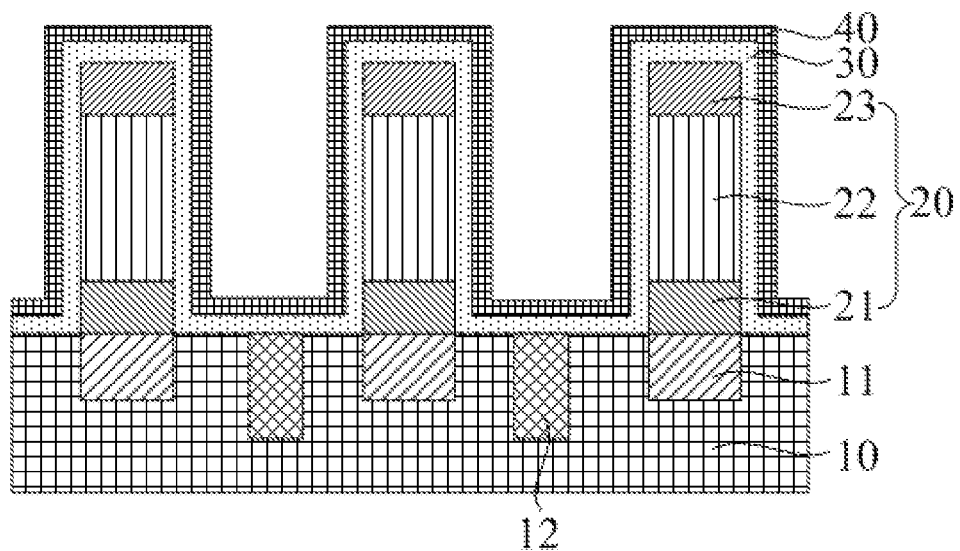
FIG. 8 is a schematic diagram of a first cross section after a dielectric layer is formed according to an embodiment of the present application.
Figure 9:
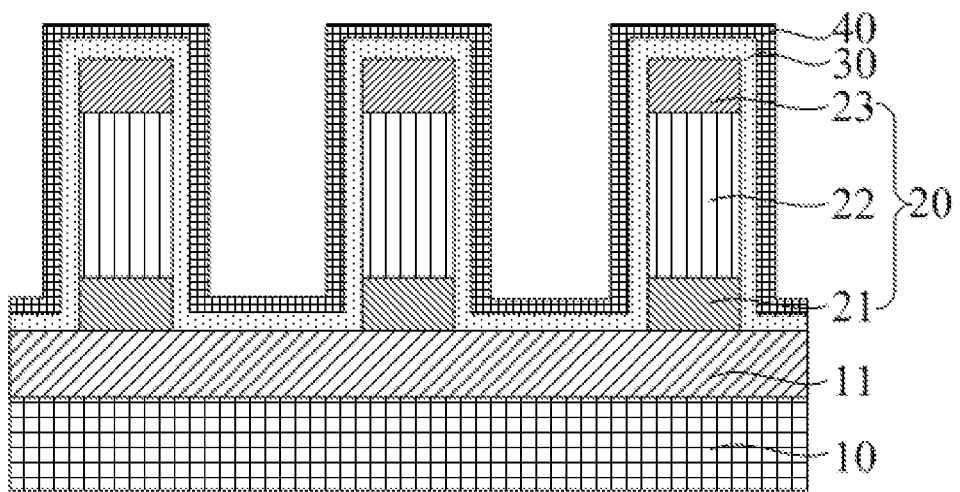
FIG. 9 is a schematic diagram of a second cross section after the dielectric layer is formed according to an embodiment of the present application.

In the embodiments of the present application, the channel layer 30 covering the laminated structures 20 and the dielectric layer 40 covering the channel layer 30 are formed in the following steps:

The channel layer 30 is deposited on the laminated structure 20 and the substrate 10, and the channel layer 30 covers the top surfaces and the side surfaces of the laminated structures 20, and the top surface of the substrate 10. With reference to FIG. 6 and FIG. 7, the channel layer 30 is formed through a deposition process. The channel layer 30 covers the top surfaces and the side surfaces of the laminated structures 20, and the top surface of the substrate 10. Then, the dielectric layer 40 is deposited on the channel layer 30. With reference to FIG. 8 and FIG. 9, the dielectric layer 40 is formed through a deposition process. The dielectric layer 40 covers the entire surface of the channel layer 30.

Step S104: Form WLs extending along a first direction, where the WL includes a plurality of contact parts and a connecting part connecting adjacent contact parts, the contact part surrounds and is in contact with a side surface of the dielectric layer, and the contact part is opposite to at least a part of the insulating layer.

Figure 10:
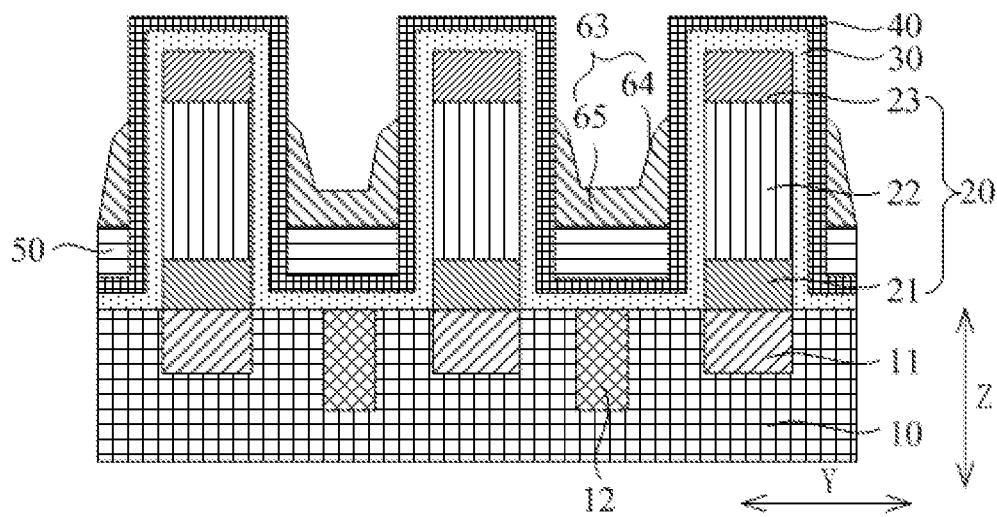
FIG. 10 is a schematic diagram of a first cross section after WLs are formed according to an embodiment of the present application.
Figure 11:
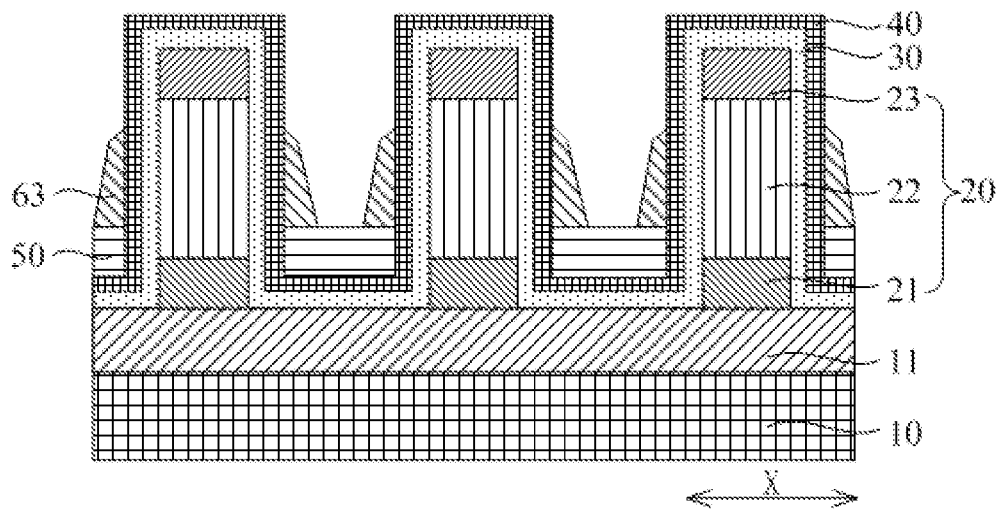
FIG. 11 is a schematic diagram of a second cross section after the WLs are formed according to an embodiment of the present application.

With reference to FIG. 10 and FIG. 11, a plurality of WLs 63 are formed between the laminated structures 20 after the channel layer 30 and the dielectric layer 40 are formed, are disposed at intervals, and extend along a first direction (a direction Y shown in FIG. 10). As shown in FIG. 10 and FIG. 11, the WL 63 includes a plurality of contact parts 64 and a connecting part 65 connecting adjacent contact parts 64. The contact part 64 surrounds and is in contact with a side surface of the dielectric layer 40.

As shown in FIG. 10 and FIG. 11, the contact part 64 corresponds to a part of the insulating layer 22. The contact part 64 serves as a gate of the transistor, that is, a part of the WL 63 serves as a gate. In a direction (a direction Z shown in FIG. 10) perpendicular to the substrate 10, the orthographic projection of the insulating layer 22 partially overlaps with that of the contact part 64. For example, the top surface of the contact part 64 is lower than that of the insulating layer 22, and a bottom of the contact part 64 is higher than that of the insulating layer 22.

Along a first direction, the connecting part 65 connects two adjacent contact parts 64. The heights of the connecting part 65 and the contact part 64 may be same or not. The specific structure of the connecting part 65 may be determined according to a specific condition.

Above all, in the embodiments of the present application, the first conductive layer 21, the insulating layer 22, and the second conductive layer 23 are stacked sequentially to form the laminated structure 20. At least one of the first conductive layer 21 and the second conductive layer 23 is a semi-metal layer, which can not only reduce a contact resistance between a laminated structure 20 and another structure, but a contact resistance between the first conductive layer 21 and/or the second conductive layer 23 and the channel layer 30, thereby improving the performance of the semiconductor structure. In addition, the first conductive layer 21, the insulating layer 22, the second conductive layer 23, the channel layer 30, the dielectric layer 40, and the contact part 64 form a vertical transistor. Adjusting the height of the laminated structure 20 can increase the height of the channel layer 30, which facilitates improving the short-channel effects of the transistor, thereby improving the performance of the semiconductor structure.

In a possible embodiment of the present application, with reference to FIG. 12 to FIG. 15, before the WLs 63 extending along the first direction are formed, where the WL 63 includes the plurality of contact parts 64 and the connecting part 65 connecting adjacent contact parts 64, the contact part 64 surrounds and is in contact with the side surface of the dielectric layer 40, and the contact part 64 is opposite to at least a part of the insulating layer 22, the manufacturing method further includes: filling a first support layer 50 between the laminated structures 20 covered by the channel layer 30 and the dielectric layer 40, where a surface of the first support layer 50 away from the substrate 10 is higher than that of the first conductive layer 21 away from substrate 10, and is lower than a surface of the insulating layer 22 away from the substrate 10.

As shown in FIG. 12 to FIG. 15, the first support layer 50 may be used as a cushion layer to increase the pitch between the WL 63 formed subsequently and the substrate 10, such that the bottom surface of the WL 63 is higher than the top surface of the first conductive layer 21, that is, the surface of the WL 63 facing the substrate 10 is higher than the surface of the first conductive layer 21 away from the substrate 10. In this case, the surface of the first support layer 50 away from the substrate 10 is lower than the surface of the insulating layer 22 away from the substrate 10, such that the bottom surface of the WL 63 is lower than the top surface of the first conductive layer 21, thereby ensuring that the WL 63 is opposite to the insulating layer 22. The material of the first support layer 50 may be silicon nitride or silicon oxynitride, and the first support layer 50 and the dielectric layer 40 have a relatively large selectivity. For example, the selectivity of the first support layer 50 to the dielectric layer 40 is greater than 5, to avoid damaging the dielectric layer 40 when the first support layer 50 is etched, thereby reducing damage on the gate oxide layer in the transistor.

Figure 12:
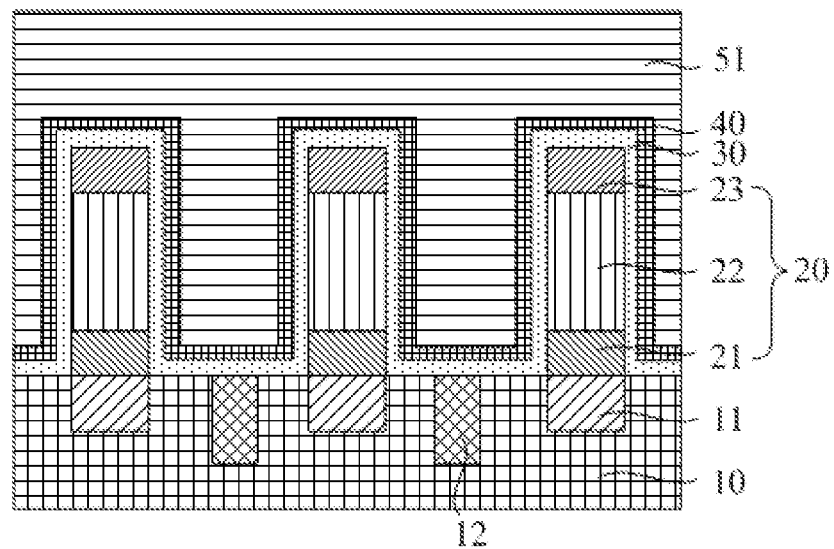
FIG. 12 is a schematic diagram of a first cross section after a first initial support layer is formed according to an embodiment of the present application.
Figure 13:
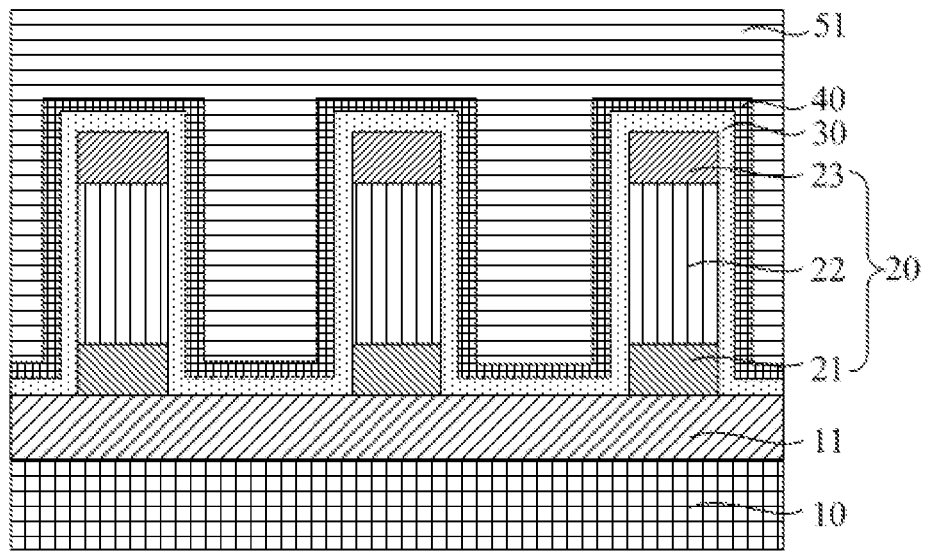
FIG. 13 is a schematic diagram of a second cross section after the first initial support layer is formed according to an embodiment of the present application.

In a possible implementation of the present application, with reference to FIG. 12 to FIG. 15, the filling a first support layer 50 between the laminated structures 20 covered by the channel layer 30 and the dielectric layer 40, where a surface of the first support layer 50 away from the substrate 10 is higher than that of the first conductive layer 21 away from the substrate 10, and is lower than a surface of the insulating layer 22 away from the substrate 10 may include the following process:

A first initial support layer 51 is formed on the dielectric layer 40, where the first initial support layer 51 is filled between the laminated structures 20 covered by the channel layer 30 and the dielectric layer 40, and the first initial support layer 51 covers a top surface of the dielectric layer 40. As shown in FIG. 12 and FIG. 13, the first initial support layer 51 is formed through deposition and is filled between the laminated structures 20 covered by the channel layer 30 and the dielectric layer 40. The first initial support layer 51 further covers the top surface of the dielectric layer 40. Specifically, the upper surface of the first initial support layer 51 is higher than the upper surface of the dielectric layer 40.

Figure 14:
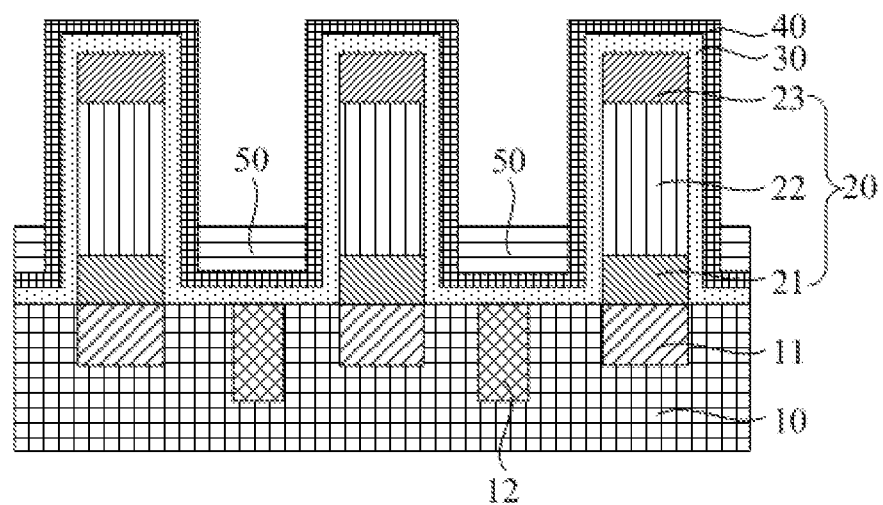
FIG. 14 is a schematic diagram of a first cross section after a first support layer is formed according to an embodiment of the present application.
Figure 15:
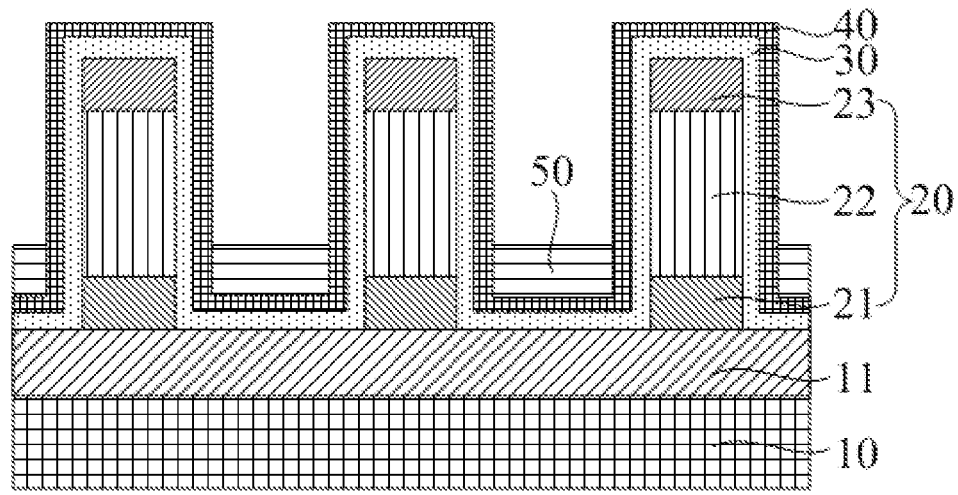
FIG. 15 is a schematic diagram of a second cross section after the first support layer is formed according to an embodiment of the present application.

After the first initial support layer 51 is formed, a part of the first initial support layer 51 is removed, and the retained first initial support layer 51 forms the first support layer 50. As shown in FIG. 14 and FIG. 15, along a direction perpendicular to the substrate 10, a part of the first initial support layer 51 is removed through dry etching or wet etching. The part of the first initial support layer 51 located between the laminated structures 20 covered by the channel layer 30 and the dielectric layer 40 is retained. The retained first initial support layer 51 forms the first support layer 50.

Based on the foregoing embodiments, after the first support layer 50 is formed, in a possible embodiment, with reference to FIG. 16 to FIG. 23, the WLs 63 extending along the first direction are formed, where the WL 63 includes the plurality of contact parts 64 and the connecting part 65 connecting adjacent contact parts 64, the contact part 64 surrounds and is in contact with the side surface of the dielectric layer 40, and the contact part 64 is opposite to at least a part of the insulating layer 22, which may include the following steps:

Step S1041: Form an initial WL layer covering the first support layer and the dielectric layer.

Figure 16:
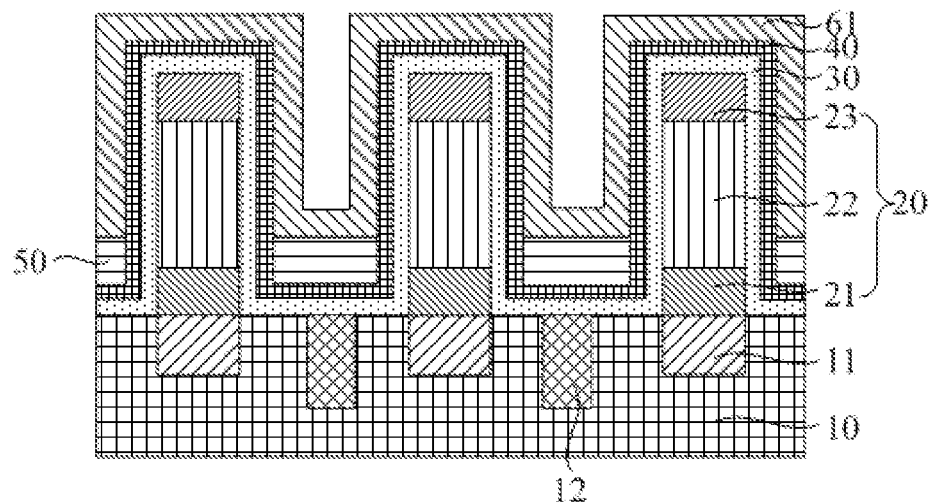
FIG. 16 is a schematic diagram of a first cross section after an initial WL layer is formed according to an embodiment of the present application.
Figure 17:
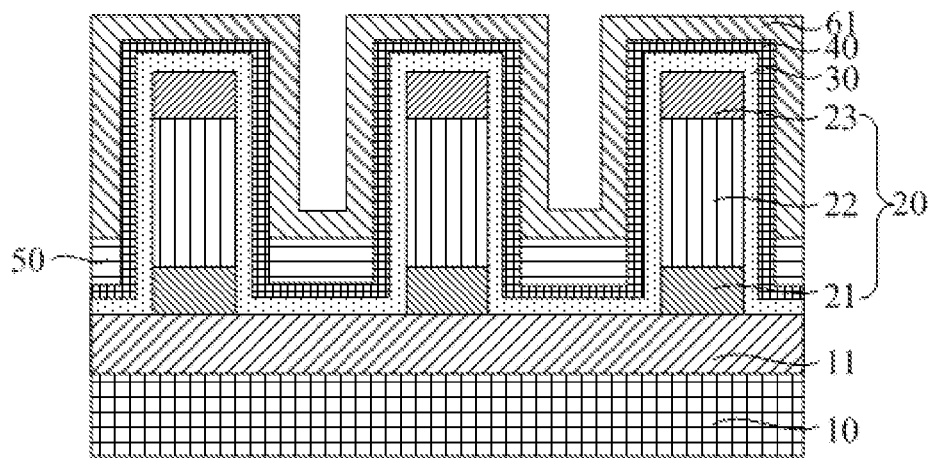
FIG. 17 is a schematic diagram of a second cross section after the initial WL layer is formed according to an embodiment of the present application.

With reference to FIG. 16 and FIG. 17, the initial WL layer 61 is formed through a deposition process, and covers the first support layer 50 and the dielectric layer 40. As shown in FIG. 16 and FIG. 17, the initial WL layer 61 covers the top surface of the first support layer 50, and covers the side surface and the top surface of the dielectric layer 40. There is also a gap in the initial WL layer 61 covering the side surfaces of the dielectric layer 40, that is, the initial WL layer 61 is not filled between the laminated structures 20 covered by the channel layer 30 and the dielectric layer 40.

Step S1042: Remove a part of the initial WL layer located on the first support layer along the first direction, such that the initial WL layer is divided, to form a plurality of intermediate WL layers arranged at intervals.

With reference to FIG. 18 to FIG. 23, the part of the initial WL layer 61 located on the first support layer 50 is removed, such that the initial WL layer 61 is divided, to form the plurality of intermediate WL layers 62 arranged at intervals. The intermediate WL layers 62 extend along the first direction, that is, a part of the initial WL layer 61 on the first support layer 50 is removed along the first direction, the retained initial WL layer 61 forms the intermediate WL layers 62.

Figure 18:
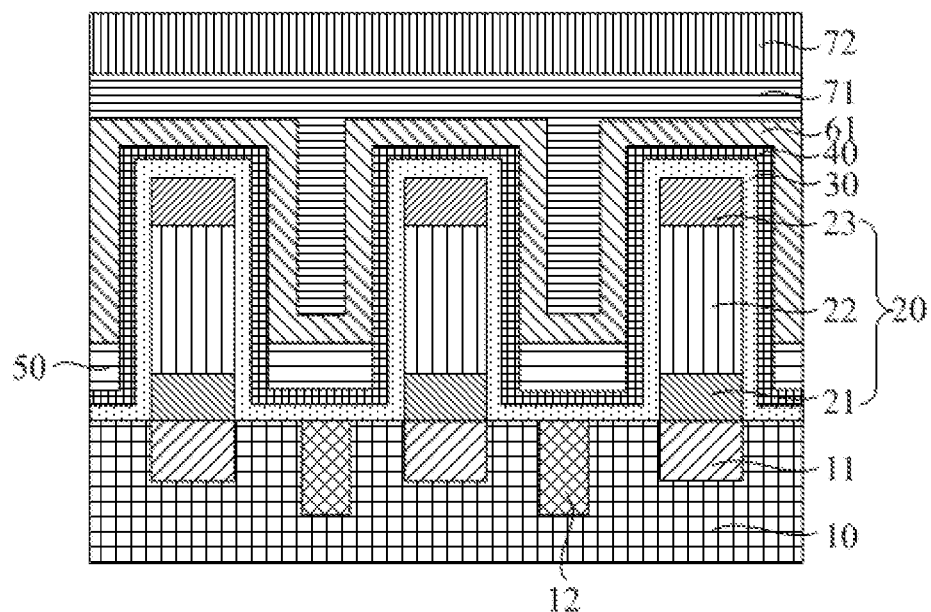
FIG. 18 is a schematic diagram of a first cross section after a first photoresist layer is formed according to an embodiment of the present application.
Figure 19:
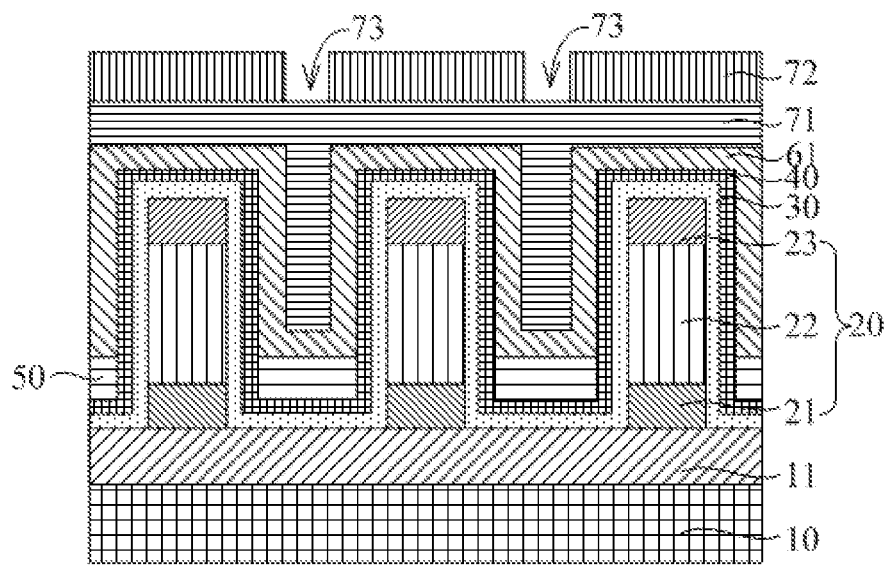
FIG. 19 is a schematic diagram of a second cross section after the first photoresist layer is formed according to an embodiment of the present application.

Specifically, as shown in FIG. 18 to FIG. 23, the part of the initial WL layer 61 located on the first support layer 50 is removed along the first direction, such that the initial WL layer 61 forms the plurality of intermediate WL layers 62 arranged at intervals, which may further include the following process:

A mask layer 71 covering the initial WL layer 61 is formed and is filled between the laminated structures 20 covered by the channel layer 30, the dielectric layer 40, and the initial WL layer 61. The mask layer 71 covers the top surface of the initial WL layer 61. As shown in FIG. 18 and FIG. 19, the mask layer 71 is deposited on the initial WL layer 61. The mask layer 71 is filled between the laminated structures 20 covered by the channel layer 30, the dielectric layer 40, and the initial WL layer 61. The mask layer 71 further covers the top surface of the initial WL layer 61. The top surface of the mask layer 71 is higher than the top surface of the initial WL layer 61.

After the mask layer 71 is formed, a first photoresist layer 72 is formed thereon. The first photoresist layer 72 is provided with a trench 73 extending along the first direction, and orthographic projection of the trench 73 on the substrate 10 and that of the initial WL layer 61 on the side surface of the laminated structure 20 on the substrate 10 do not overlap. As shown in FIG. 18 and FIG. 19, the first photoresist layer 72 is spin-coated on the mask layer 71. The first photoresist layer 72 is provided with a trench 73 running through the first photoresist layer 72. The trench 73 is staggered from the initial WL layer 61 on the side surface and the top surface of the dielectric layer 40, and is opposite to a part of the initial WL layer 61 on the first support layer 50.

Figure 20:
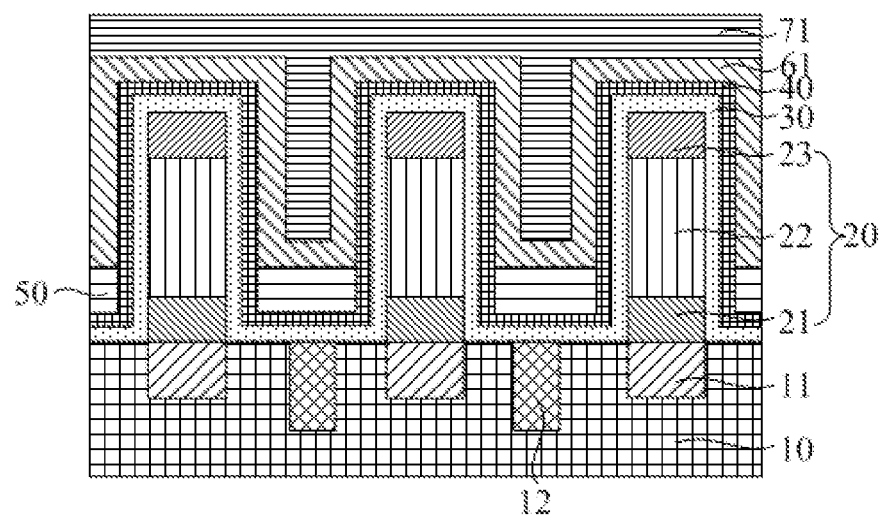
FIG. 20 is a schematic diagram of a first cross section after a mask layer is etched according to an embodiment of the present application.
Figure 21:
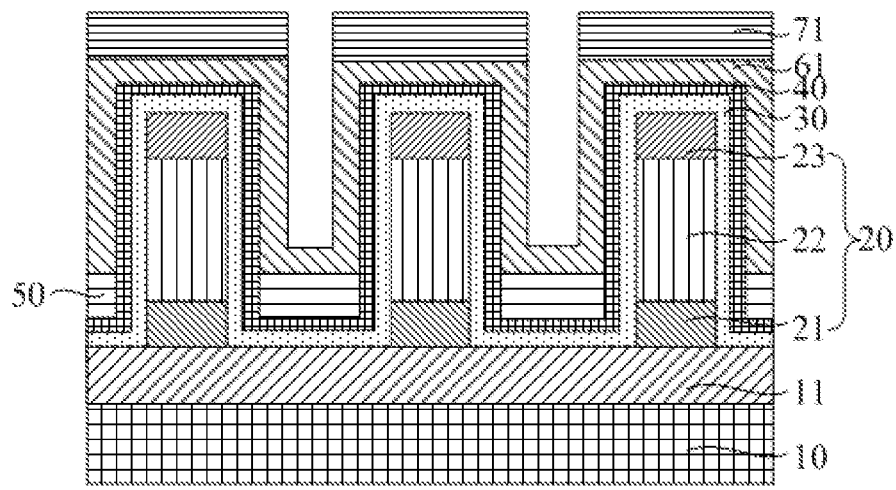
FIG. 21 is a schematic diagram of a second cross section after the mask layer is etched according to an embodiment of the present application.

After the first photoresist layer 72 is formed, the mask layer 71 is etched by using the first photoresist layer 72 as a mask. The mask layer 71 is etched by using the first photoresist layer 72 as a mask. The pattern on the first photoresist layer 72 is transferred to the mask layer 71. As shown in FIG. 20 and FIG. 21, the initial WL layer 61 is exposed from the pattern formed by the mask layer 71.

Figure 22:
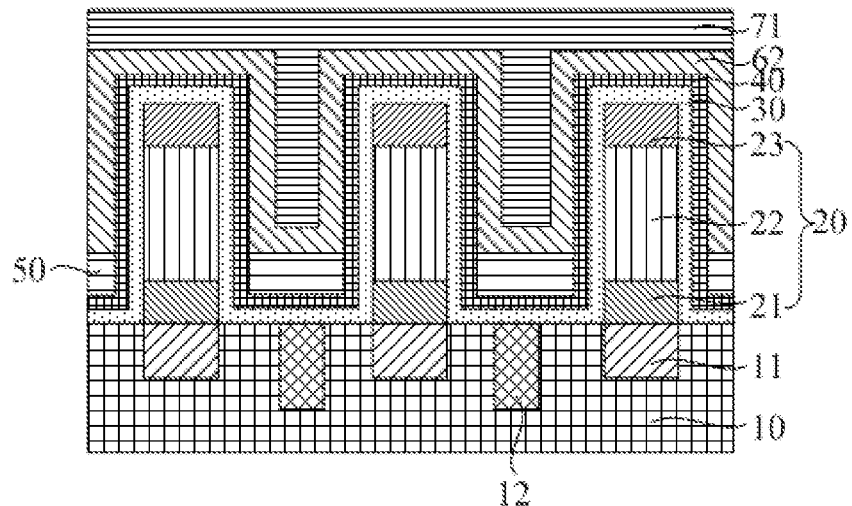
FIG. 22 is a schematic diagram of a first cross section after intermediate WL layers are formed according to an embodiment of the present application.
Figure 23:
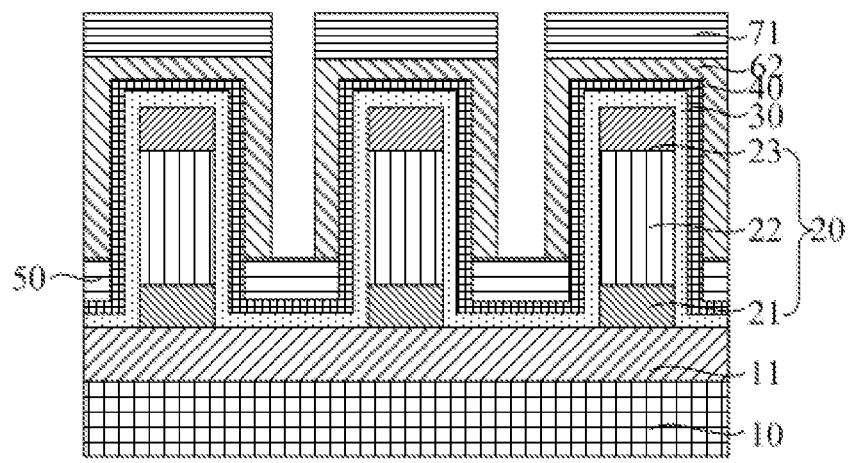
FIG. 23 is a schematic diagram of a second cross section after the intermediate WL layers are formed according to an embodiment of the present application.

After the mask layer 71 is etched, the initial WL layer 61 is etched by using the etched mask layer 71 as a mask, to form the intermediate WL layers 62. A part of the initial WL layer 61 on the first support layer 50 is removed through anisotropic etching. As shown in FIG. 22 and FIG. 23, the retained initial WL layer 61 forms intermediate WL layers 62. Gaps between a plurality of intermediate WL layers 62 expose the first support layer 50.

Step S1043: Remove the intermediate WL layer on a top surface of the dielectric layer, and a part of the intermediate WL layer away from the substrate on the side surface of the dielectric layer, and taking the retained intermediate WL layers as the WLs.

The intermediate WL layer 62 on a top surface of the dielectric layer 40 and a part of the intermediate WL layer 62 on the side surface of the dielectric layer 40 are removed through etching. The retained intermediate WL layers 62 form the WLs 63. As shown in FIG. 10 and FIG. 11, the top surface of the WL 63 is lower than the top surface of the insulating layer 22, and the WL 63 is opposite to the insulating layer 22.

Figure 24:
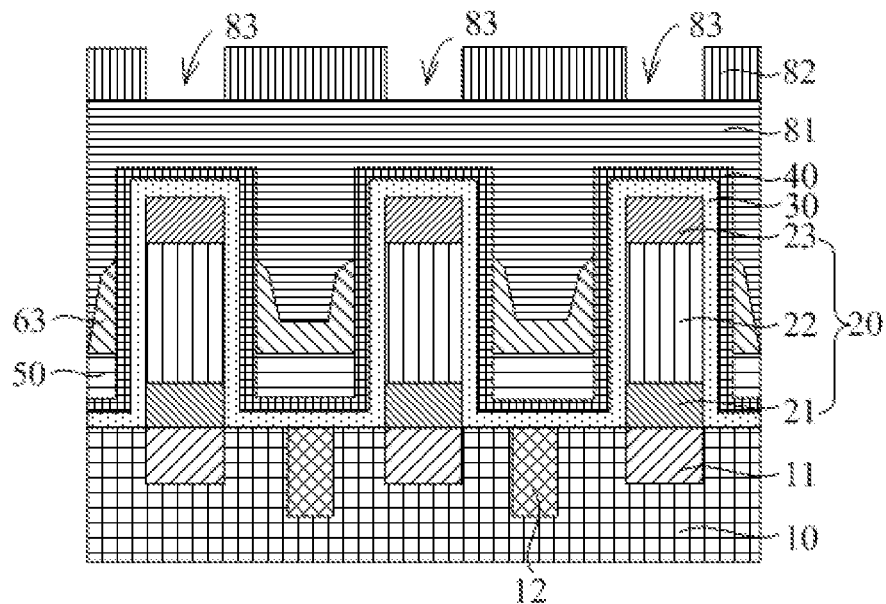
FIG. 24 is a schematic diagram of a first cross section after a second photoresist layer is formed according to an embodiment of the present application.
Figure 25:
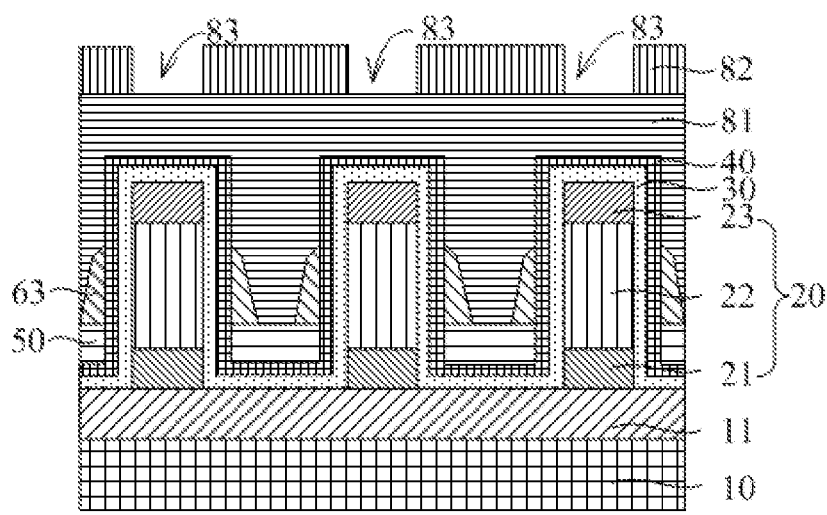
FIG. 25 is a schematic diagram of a second cross section after the second photoresist layer is formed according to an embodiment of the present application.

In another possible embodiment of the present application, after the WLs 63 extending along the first direction are formed, where the WL 63 includes the plurality of contact parts 64 and the connecting part 65 connecting adjacent contact parts 64, the contact part 64 is connected to the laminated structure 20, and the contact part 64 surrounds the side surface of the dielectric layer 40, with reference to FIG. 24 to FIG. 33, the manufacturing method of the semiconductor structure further includes:

forming a second support layer 81 covering the WLs 63, the first support layer 50, and the second support layer 50 on the dielectric layer 40. As shown in FIG. 24 and FIG. 25, the second support layer 81 is deposited. The second support layer 81 covers the WLs 63, the first support layer 50, and the dielectric layer 40. The top surface of the second support layer 81 is higher than the top surface of the dielectric layer 40. The surface of the second support layer 81 away from the substrate 10 may be flat. For example, the second support layer 81 is flattened, through, for example, chemical mechanical polishing (CMP), to make the top surface of the second support layer 81 flat. The second support layer 81 and the first support layer 50 may be made of a same insulating material, such that the second support layer 81 is integrated with the first support layer 50. The second support layer 81 and the first support layer 50 cover and isolate the WLs 63 to insulate the WLs 63.

After the second support layer 81 is formed, the second photoresist layer 82 is formed on the second support layer 81. The second photoresist layer 82 is provided with a plurality of openings 83. The openings 83 are opposite to the laminated structures 20. As shown in FIG. 24 and FIG. 25, the second photoresist layer 82 is formed on the second support layer 81. The second photoresist layer 82 is provided with a plurality of openings 83. The plurality of openings 83 correspond to the plurality of laminated structures 20 respectively, and the opening 83 is opposite to the laminated structure 20 corresponding thereto. Orthographic projection of the opening 83 on the substrate 10 is located within that of the laminated structure 20 corresponding thereto on the substrate 10, or the orthographic projection of the opening 83 on the substrate 10 overlaps with that of the laminated structure 20 corresponding thereto on the substrate 10.

Figure 26:
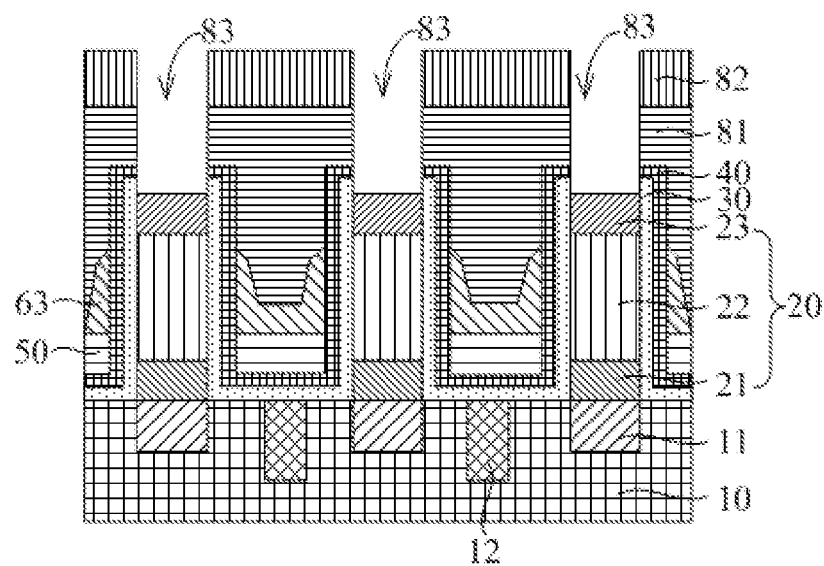
FIG. 26 is a schematic diagram of a first cross section after a contact hole is formed according to an embodiment of the present application.
Figure 27:
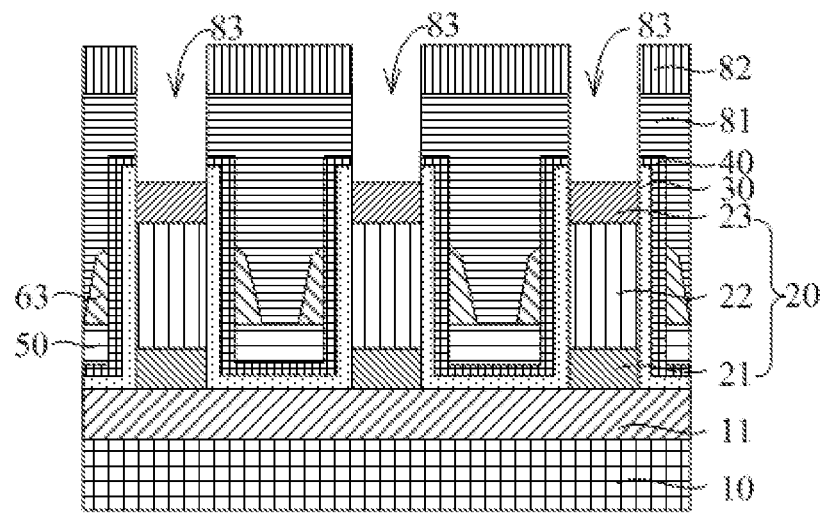
FIG. 27 is a schematic diagram of a second cross section after the contact hole is formed according to an embodiment of the present application.
Figure 28:
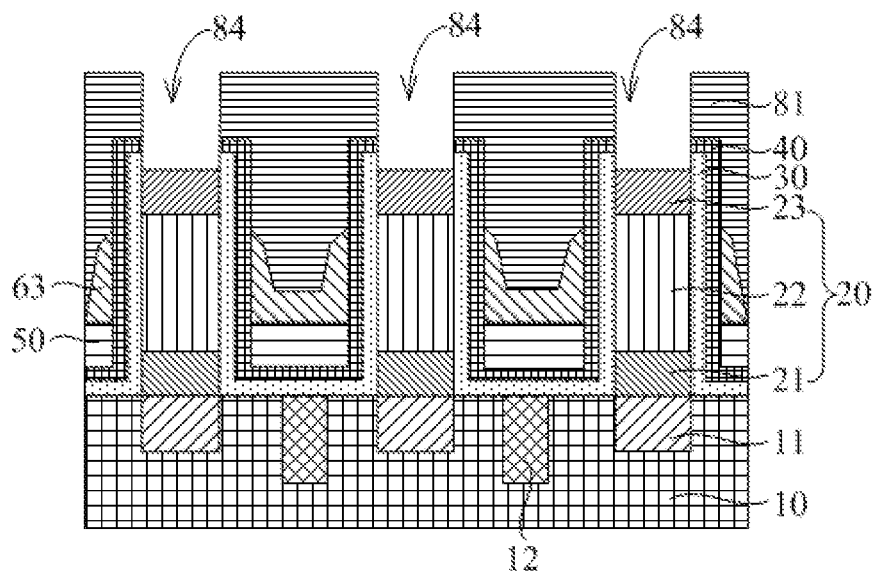
FIG. 28 is a schematic diagram of a first cross section after the second photoresist layer is removed according to an embodiment of the present application.
Figure 29:
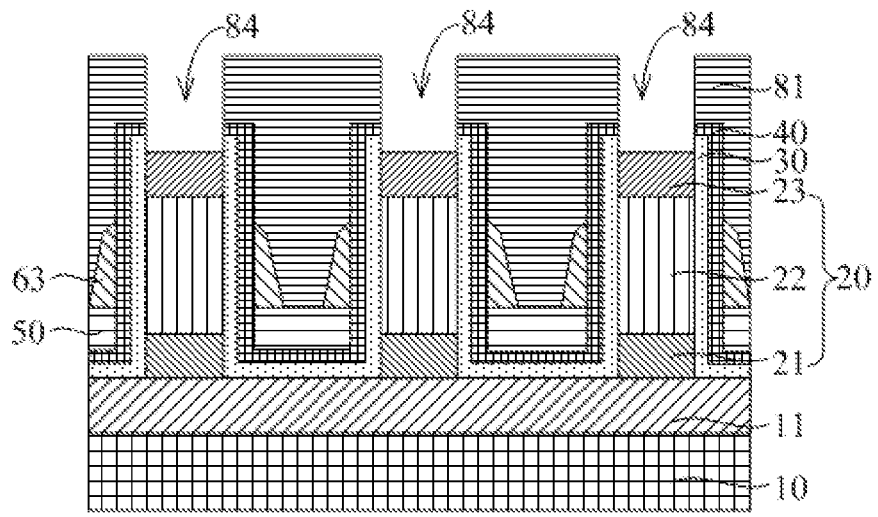
FIG. 29 is a schematic diagram of a second cross section after the second photoresist layer is removed according to an embodiment of the present application.

After the second photoresist layer 82 is formed, the second support layer 81, the dielectric layer 40, and the channel layer 30 are etched by using the second photoresist layer 82 as a mask, to form the contact hole 84. The contact hole 84 exposes the second conductive layer 23. As shown in FIG. 26 and FIG. 27, the contact hole 84 runs through the second support layer 81, the dielectric layer 40, and the channel layer 30, to expose the second conductive layer 23. The second photoresist layer 82 is removed while the contact hole 84 is formed, or the second photoresist layer 82 is removed after the contact hole 84 is formed. As shown in FIG. 28 and FIG. 29, after the second photoresist layer 82 is removed, the top surface of the second support layer 81 is exposed.

It should be noted that an area of an opening 83 at the contact hole 84 is greater than that of a bottom of the contact hole 84, that is, a width of an upper part of the contact hole 84 is relatively large while a width of its lower part is relatively small. Through such a disposal, after the third conductive layer 90 is formed in the contact hole 84, a width of an upper part of the third conductive layer 90 is relatively large. Adding the width of the operation window facilitates the alignment with the capacitor. In addition, the width of the lower part of the third conductive layer 90 is relatively small, which can reduce the critical dimension of the transistor.

Figure 30:
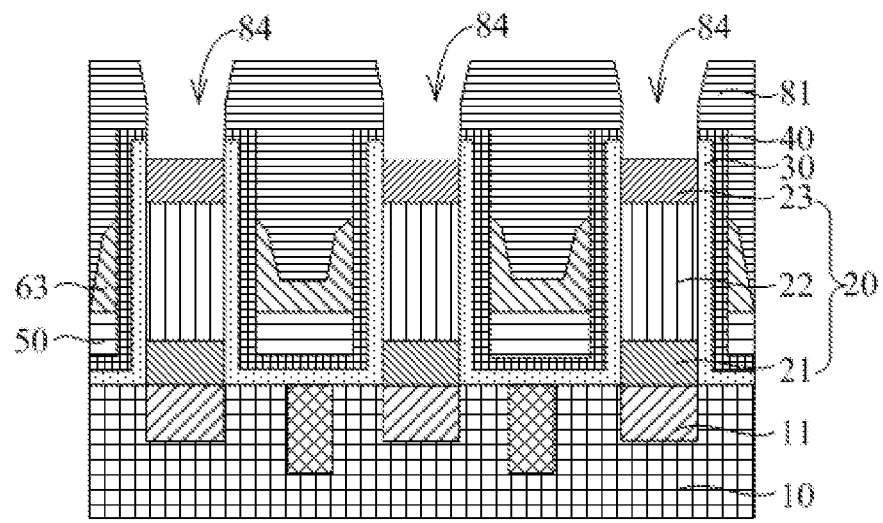
FIG. 30 is another schematic diagram of the first cross section after the contact hole is formed according to an embodiment of the present application.
Figure 31:
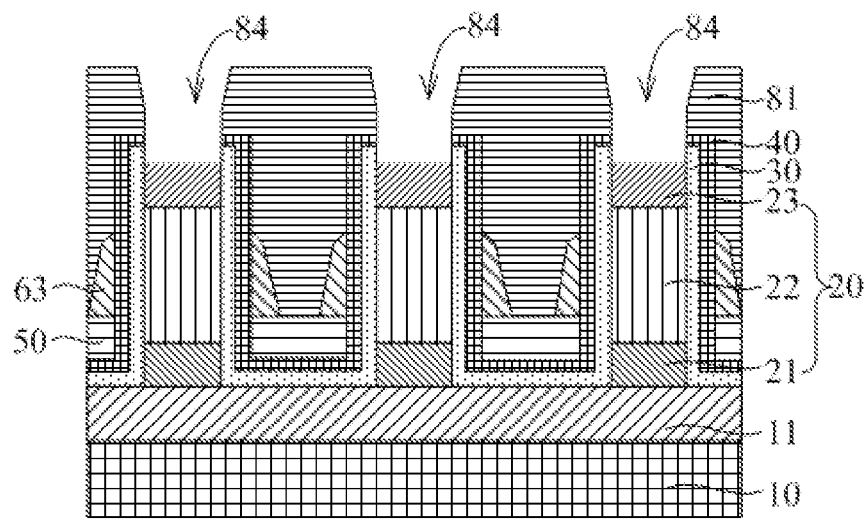
FIG. 31 is another schematic diagram of the second cross section after the contact hole is formed according to an embodiment of the present application.

For example, a plane perpendicular to the substrate 10 is used as a cross section. A shape of a cross section of the contact hole 84 may be an inverted trapezoid with a large top and a small bottom. As shown in FIG. 30 and FIG. 31, the shape of the cross section of the contact hole 84 may be also a rectangle and a trapezoid that are connected to each other. The rectangle is disposed at one side of the trapezoid close to the substrate 10, and a bottom edge of the rectangle coincides with an upper bottom of the trapezoid.

Figure 32:
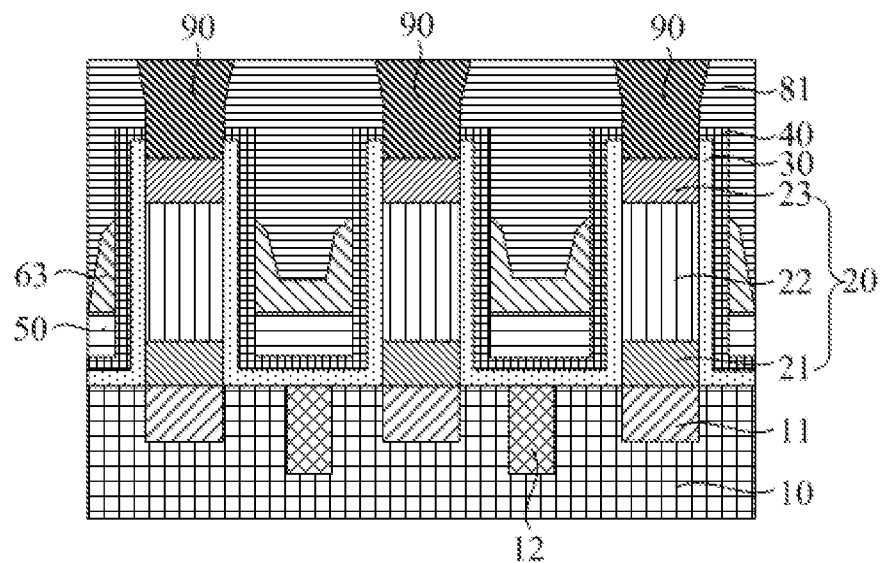
FIG. 32 is a schematic diagram of a first cross section after a third conductive layer is formed according to an embodiment of the present application.
Figure 33:
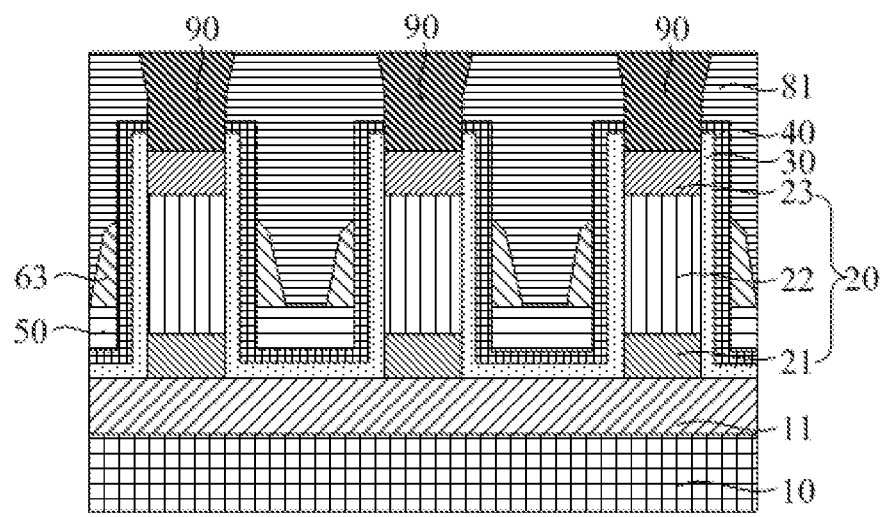
FIG. 33 is a schematic diagram of a second cross section after the third conductive layer is formed according to an embodiment of the present application.

After the contact hole 84 is formed, the third conductive layer 90 is formed in the contact hole 84, and the third conductive layer 90 is electrically connected to the second conductive layer. As shown in FIG. 32 and FIG. 33, the third conductive layer 90 is deposited in the contact hole 84, and the third conductive layer 90 is in contact with the second conductive layer 23, such that the third conductive layer 90 is electrically connected to the second conductive layer 23.

The third conductive layer 90 may be a capacitive contact pad, and a capacitor is formed on the third conductive layer 90.

With reference to FIG. 10 and FIG. 11, an embodiment of the present application is further provides a semiconductor structure, including: laminated structures 20, a channel layer 30, a dielectric layer 40, and a gate. The laminated structures 20 are disposed on the substrate 10. The substrate 10 is configured to support the laminated structures 20. The substrate 10 may be a semiconductor substrate such as a silicon substrate.

A plurality of BLs 11 may be also disposed in the substrate 10, are spaced apart from each other, and extend along the second direction (the direction X shown in FIG. 11). The BLs 11 may be exposed on the surface of the substrate 10, to be electrically connected to another structure on the substrate 10. An STI structure 12 may also be disposed between adjacent BLs 11, which are isolated by the STI structure structures 12.

The plurality of laminated structures 20 are formed on the substrate 10, and are disposed at intervals. The laminated structure 20 includes a first conductive layer 21, an insulating layer 22, and a second conductive layer 23 that are stacked. As shown in FIG. 10 and FIG. 11, along the direction away from the substrate 10, the first conductive layer 21, the insulating layer 22, and the second conductive layer 23 are disposed sequentially. One of the first conductive layer 21 and the second conductive layer 23 is a source, the other of the first conductive layer 21 and the second conductive layer 23 is a drain. At least one of the source and the drain is a semi-metal layer. The material of the semi-metal layer may be bismuth, and the material of the insulating layer 22 may be silicon oxide. Disposing at least one of the source or the drain as a semi-metal layer can reduce the contact resistance between the laminated structure 20 and another structure (for example, the BL 11 and/or the capacitor), thereby improving the performance of the semiconductor structure.

With reference to FIG. 10 and FIG. 11, along the second direction, at least one of the laminated structures 20 is disposed on each of the BLs 11, and one of the source and the drain in the laminated structure 20 is in contact with the BL 11, such that the source or drain is electrically connected to the BL 11. The laminated structure 20 may be in a shape of a column, such as a cylinder, an elliptical column, a square column, or a rectangular column. The laminated structures 20 may be arranged in an array.

The channel layer 30 covers the side surface of the laminated structure 20. The channel layer 30 surrounding the side surface of the laminated structure 20 forms a channel region, to provide a conductive channel between the source and the drain, such that carriers can move from the source to the drain or vice versa. The channel region is layered. A material of the channel layer 30 may include molybdenum sulfide, such as molybdenum disulfide. There is a band gap in the layered molybdenum sulfide, which forms a field effect transistor with a high on-off ratio. Preferably, the material of the channel layer 30 is molybdenum sulfide, and the materials of the source and the drain are both bismuth, to reduce the MIGSs and energy barriers between the channel layer 30 and the source, and between the channel layer 30 and the drain, thereby reducing the contact resistances between the channel layer 30 and the source and between the channel layer 30 and the drain.

The dielectric layer 40 covers the side surface of the channel layer 30 and may be an oxide layer. The dielectric layer 40 located on the side surface of the channel layer 30 forms a gate oxide layer. For example, the dielectric layer 40 is made of silicon oxide.

Withe reference to FIG. 10 and FIG. 11, a gate is annularly provided on the dielectric layer 40. The gate surrounds and is in contact with the side surface of the dielectric layer 40. The gate is opposite to at least a part of the insulating layer 22. Along a direction (the direction Z shown in FIG. 10) perpendicular to the substrate 10, the orthographic projection of the dielectric layer 40 at least partially overlaps with that of the gate. For example, the top surface of the gate is lower than the top surface of the dielectric layer 40, and the bottom surface of the gate is higher than the bottom surface of the dielectric layer 40.

The semiconductor structure in the embodiments of the present application further includes WLs 63. The WLs 63 extend along the first direction. The WL 63 includes contact parts 64 and a connecting part 65 connecting two adjacent contact parts 64. The contact part 64 is a gate disposed annularly on the dielectric layer 40, that is, a part of the WL 63 is a gate. It can be understood that, along the first direction, the connecting part 65 and the gate are arranged at intervals, and the connecting part 65 connects the plurality of gates in the first direction into one to form the WLs 63.

In some possible examples, with reference to FIG. 32 and FIG. 33, the WL 63 is disposed on the first support layer 50. The first support layer 50 is located below the WL 63 and is filled between laminated structures 20 covered by the dielectric layer 40 and the channel layer 30, to elevate the WLs 63. The second support layer 81 may further cover the WLs 63, and the second support layer 81 and the first support layer 50 electrically isolate the WLs 63. The second support layer 81 and the first support layer 50 may be made of a same material, such that the second support layer 81 is integrated with the first support layer 50.

With reference to FIG. 32 and FIG. 33, the second support layer 81 also covers the dielectric layer 40. The second support layer 81 is provided with a contact hole running through the dielectric layer 40 and the channel layer 30, to expose the second conductive layer 23 in the laminated structures 20. The third conductive layer 90 fills the contact hole, and one end of the third conductive layer 90 is in contact with the second conductive layer 23, such that the third conductive layer 90 is electrically connected to the second conductive layer 23. The other end of the third conductive layer 90 may be connected to a capacitor.

In the semiconductor structure provided by the embodiments of the present application, the first conductive layer 21, the insulating layer 22, and the second conductive layer 23 are stacked sequentially to form the laminated structure 20. One of the first conductive layer 21 and the second conductive layer 23 is the source and the other is the drain. At least one of the first conductive layer 21 and the second conductive layer 23 is a semi-metal layer, which can not only reduce a contact resistance between a laminated structure 20 and another structure, but a contact resistance between the first conductive layer 21 and/or the second conductive layer 23 and the channel layer 30, thereby improving the performance of the semiconductor structure. In addition, the channel layer 30 covers the side surface of the laminated structure 20. The dielectric layer 40 covers the side surface of the channel layer 30. A gate is annularly provided on the dielectric layer 40. The laminated structures 20, the channel layer 30, the dielectric layer 40, and the gate form a vertical transistor. Adjusting the height of the laminated structure 20 can increase the height of the channel layer 30, which facilitates improving the short-channel effects of the transistor, thereby improving the performance of the semiconductor structure.

The embodiments or implementations of this specification are described in a progressive manner, and each embodiment focuses on differences from other embodiments. The same or similar parts between the embodiments may refer to each other.

In the descriptions of this specification, a description with reference to the term "one implementation", "some implementations", "an exemplary implementation", "an example", "a specific example", "some examples", or the like means that a specific feature, structure, material, or characteristic described in combination with the implementation(s) or example(s) is included in at least one implementation or example of the present application. In this specification, the schematic expression of the above terms does not necessarily refer to the same embodiment or example. Moreover, the described specific feature, structure, material or characteristic may be combined in an appropriate manner in any one or more implementations or examples.

Finally, it should be noted that the above embodiments are merely used to explain the technical solutions of the present application, but are not intended to limit the present application. Although the present application is described in detail with reference to the foregoing embodiments, those of ordinary skill in the art should understand that they can still modify the technical solutions described in the foregoing embodiments, or make equivalent substitutions on some or all technical features therein. These modifications or substitutions do not make the essence of the corresponding technical solutions deviate from the spirit and scope of the technical solutions of the embodiments of the present application.

The invention claimed is:

1. A manufacturing method of a semiconductor structure, comprising:
   providing a substrate;
   forming a plurality of laminated structures arranged at intervals on the substrate, wherein each of the laminated structures comprises a first conductive layer, an insulating layer, and a second conductive layer that are stacked sequentially, and at least one of the first conductive layer and the second conductive layer is a semi-metal layer;
   forming a channel layer covering the laminated structures, and a dielectric layer covering the channel layer; and
   forming word lines (WLs) extending along a first direction, wherein the WL comprises a plurality of contact parts and a connecting part connecting adjacent contact parts, the contact part surrounds and is in contact with a side surface of the dielectric layer, and the contact part is opposite to at least a part of the insulating layer.

2. The manufacturing method of a semiconductor structure according to claim 1, wherein a material of the channel layer comprises molybdenum sulfide, and/or a material of the semi-metal layer comprises bismuth.

3. The manufacturing method of a semiconductor structure according to claim 1, wherein the forming a channel layer covering the laminated structures, and a dielectric layer covering the channel layer comprises:
   depositing the channel layer on the laminated structures and the substrate, wherein the channel layer covers top surfaces and side surfaces of the laminated structures, and a top surface of the substrate; and
   depositing the dielectric layer on the channel layer.

4. The manufacturing method of a semiconductor structure according to claim 3, before the forming WLs extending along a first direction, wherein the WL comprises a plurality of contact parts and a connecting part connecting adjacent contact parts, the contact part surrounds and is in contact with a side surface of the dielectric layer, and the contact part is opposite to at least a part of the insulating layer, the manufacturing method further comprises:
   filling a first support layer between the laminated structures covered by the channel layer and the dielectric layer, wherein a surface of the first support layer away from the substrate is higher than that of the first conductive layer away from the substrate, and is lower than a surface of the insulating layer away from the substrate.

5. The manufacturing method of a semiconductor structure according to claim 4, wherein the filling a first support layer between the laminated structures covered by the channel layer and the dielectric layer, wherein a surface of the first support layer away from the substrate is higher than that of the first conductive layer away from the substrate, and is lower than a surface of the insulating layer away from the substrate comprises:
   forming a first initial support layer on the dielectric layer, wherein the first initial support layer is filled between the laminated structures covered by the channel layer and the dielectric layer, and the first initial support layer covers a top surface of the dielectric layer; and
   removing a part of the first initial support layer, and taking the retained first initial support layer as the first support layer.

6. The manufacturing method of a semiconductor structure according to claim 4, wherein the forming WLs extending along a first direction, wherein the WL comprises a plurality of contact parts and a connecting part connecting adjacent contact parts, the contact part surrounds and is in contact with a side surface of the dielectric layer, and the contact part is opposite to at least a part of the insulating layer comprises:
   forming an initial WL layer covering the first support layer and the dielectric layer;
   removing a part of the initial WL layer located on the first support layer along the first direction, such that the initial WL layer is divided, to form a plurality of intermediate WL layers arranged at intervals; and
   removing the intermediate WL layer on a top surface of the dielectric layer, and a part of the intermediate WL layer away from the substrate on the side surface of the dielectric layer, and taking the retained intermediate WL layers as the WLs.

7. The manufacturing method of a semiconductor structure according to claim 6, wherein the removing a part of the initial WL layer located on the first support layer along the first direction, such that the initial WL layer is divided, to form a plurality of intermediate WL layers arranged at intervals comprises:
   forming a mask layer covering the initial WL layer, wherein the mask layer is filled between the laminated structures covered by the channel layer, the dielectric layer, and the initial WL layer, and the mask layer covers a top surface of the initial WL layer;
   forming a first photoresist layer on the mask layer, wherein the first photoresist layer is provided with a trench extending along the first direction, and orthographic projection of the trench on the substrate and that of the initial WL layer on the side surface of the laminated structure on the substrate do not overlap;
   etching the mask layer by the first photoresist layer as a mask; and etching the initial WL layer by the etched mask layer as a mask, to form the intermediate WL layers.

8. The manufacturing method of a semiconductor structure according to claim 4, after the forming WLs extending along a first direction, wherein the WL comprises a plurality of contact parts and a connecting part connecting adjacent contact parts, the contact part surrounds and is in contact with a side surface of the dielectric layer, and the contact part is opposite to at least a part of the insulating layer, the manufacturing method further comprises:
    forming a second support layer covering the WLs, the first support layer, and the dielectric layer, wherein a surface of the second support layer away from the substrate is flat;
    forming a second photoresist layer on the second support layer, wherein the second photoresist layer is provided with a plurality of openings, and the openings are directly opposite to the laminated structures;
    etching the second support layer, the dielectric layer, and the channel layer by the second photoresist layer as a mask, to form a contact hole, wherein the contact hole exposes the second conductive layer; and
    forming a third conductive layer in the contact hole, wherein the third conductive layer is electrically connected to the second conductive layer.

9. The manufacturing method of a semiconductor structure according to claim 8, wherein an area of an opening of the contact hole is greater than that of a bottom of the contact hole.

10. The manufacturing method of a semiconductor structure according to claim 9, wherein a plane perpendicular to the substrate is used as a cross section, a shape of a cross section of the contact hole comprises a rectangle and a trapezoid that are connected to each other, the rectangle is disposed at one side of the trapezoid close to the substrate, and a bottom edge of the rectangle coincides with an upper bottom of the trapezoid.

11. The manufacturing method of a semiconductor structure according to claim 1, wherein a plurality of bit lines (BLs) are arranged at intervals in the substrate, and the BLs extend along a second direction; and
    at least one of the laminated structures is disposed on each of the BLs along the second direction, and the first conductive layer is electrically connected to the BLs.

12. The manufacturing method of a semiconductor structure according to claim 11, wherein a shallow trench isolation (STI) structure is also disposed in the substrate, and the STI structure is disposed between adjacent BLs.

13. A semiconductor structure, comprising: laminated structures, a channel layer covering side surfaces of the laminated structures, and a dielectric layer covering a side surface of the channel layer, and a gate annularly provided on the dielectric layer; wherein
    each of the laminated structures comprises a first conductive layer, an insulating layer, and a second conductive layer that are stacked sequentially, one of the first conductive layer and the second conductive layer is a source, the other of the first conductive layer and the second conductive layer is a drain, and at least one of the source and the drain is a semi-metal layer.

14. The semiconductor structure according to claim 13, wherein a material of the channel layer comprises molybdenum sulfide, and/or a material of the semi-metal layer comprises bismuth.

15. The semiconductor structure according to claim 13, wherein the semiconductor structure further comprises word lines (WLs) and bit lines (BLs); and
    the BLs are disposed in a substrate, the laminated structures are disposed on the substrate, one of the source and the drain is electrically connected to the BL, the WL comprises gates and a connecting part connecting two adjacent gates.

* * * * *